US011300598B2

(12) United States Patent
Lavedas

(10) Patent No.: US 11,300,598 B2
(45) Date of Patent: Apr. 12, 2022

(54) ALTERNATIVE NEAR-FIELD GRADIENT PROBE FOR THE SUPPRESSION OF RADIO FREQUENCY INTERFERENCE

(71) Applicant: Tom Lavedas, Moneta, VA (US)

(72) Inventor: Tom Lavedas, Moneta, VA (US)

( * ) Notice: Subject to any disclaimer, the term of this patent is extended or adjusted under 35 U.S.C. 154(b) by 213 days.

(21) Appl. No.: 16/697,127

(22) Filed: Nov. 26, 2019

(65) Prior Publication Data
US 2020/0264220 A1 Aug. 20, 2020

Related U.S. Application Data

(60) Provisional application No. 62/771,327, filed on Nov. 26, 2018.

(51) Int. Cl.
G01R 29/08 (2006.01)
G01R 31/315 (2006.01)

(52) U.S. Cl.
CPC ....... G01R 29/0878 (2013.01); G01R 31/315 (2013.01)

(58) Field of Classification Search
CPC ...... G01R 1/06711; G01R 1/07; G01R 15/18; G01R 15/183; G01R 29/0871; G01R 31/58; G01R 33/0017
See application file for complete search history.

(56) References Cited

U.S. PATENT DOCUMENTS

| | | |
|---|---|---|
| 1,911,234 A | 5/1933 | Meyer |
| 2,740,114 A | 3/1956 | Stanley |
| 2,954,538 A | 9/1960 | Horgan |
| 3,284,801 A | 11/1966 | Bryant |
| 3,453,630 A | 7/1969 | Thompson |
| 3,683,389 A | 8/1972 | Hollis |
| 3,774,221 A | 11/1973 | Francis |
| 3,823,403 A | 7/1974 | Walter et al. |
| 3,950,756 A | 4/1976 | Tisler |
| 4,160,978 A | 7/1979 | DuHamel |
| 4,217,550 A | 8/1980 | Blassel et al. |
| 4,260,990 A | 4/1981 | Lichtblau |
| 4,375,289 A | 3/1983 | Schmall et al. |

(Continued)

FOREIGN PATENT DOCUMENTS

| | | |
|---|---|---|
| JP | H11-313017 | 11/1999 |
| WO | WO 2006/107862 | 10/2006 |
| WO | WO 2010/002821 | 1/2010 |

OTHER PUBLICATIONS

PCT International Preliminary Report on Patentability of the ISA dated Jan. 5, 2011 for PCT Patent App. No. PCT/US2009/049136; 8 pages.

(Continued)

Primary Examiner — Tung X Nguyen
(74) Attorney, Agent, or Firm — Wolter Van Dyke Davis, PLLC; John L. DeAngelis; Eugene J. Molinelli

(57) ABSTRACT

A sensor probe. The probe includes a central loop and a plurality of peripheral loops disposed peripherally relative to the central loop. To maximize far-field suppression, current flows in a first direction through the central loop and in a second direction through each one of the plurality of peripheral loops, the first direction opposite to the second direction, and current through the central loop equals current through the plurality of peripheral loops.

16 Claims, 10 Drawing Sheets

(56) References Cited

U.S. PATENT DOCUMENTS

| | | | |
|---|---|---|---|
| 4,680,591 A | 7/1987 | Axford et al. | |
| 4,691,208 A | 9/1987 | Stem | |
| 4,788,624 A | 11/1988 | Strange | |
| 4,791,285 A | 12/1988 | Ohki | |
| 4,920,352 A | 4/1990 | Martensson et al. | |
| 4,977,614 A | 12/1990 | Kurcbart | |
| 5,041,791 A * | 8/1991 | Ackerman | G01R 33/341 324/318 |
| 5,061,941 A | 10/1991 | Lizzi et al. | |
| 5,101,214 A | 3/1992 | Ohtsuka et al. | |
| 5,128,686 A | 7/1992 | Tan et al. | |
| 5,206,592 A | 4/1993 | Buess et al. | |
| 5,221,902 A | 6/1993 | Jones et al. | |
| 5,227,725 A | 7/1993 | Cory et al. | |
| 5,233,300 A | 8/1993 | Buess et al. | |
| 5,237,165 A | 8/1993 | Tingley, III | |
| 5,321,412 A | 6/1994 | Kopp et al. | |
| 5,459,451 A | 10/1995 | Crossfield et al. | |
| 5,513,383 A | 4/1996 | Tsao | |
| 5,572,226 A | 11/1996 | Tuttle | |
| 5,602,556 A | 2/1997 | Bowers | |
| 5,608,321 A | 3/1997 | Garroway et al. | |
| 5,712,566 A | 1/1998 | Taicher et al. | |
| 5,804,967 A | 9/1998 | Miller et al. | |
| 5,817,207 A | 10/1998 | Leighton | |
| 5,903,242 A | 5/1999 | Tsuru et al. | |
| 5,914,692 A | 6/1999 | Bowers et al. | |
| 5,945,958 A | 8/1999 | Staufer et al. | |
| 6,031,508 A | 2/2000 | Ishizuka et al. | |
| 6,054,856 A | 4/2000 | Garroway et al. | |
| 6,147,605 A | 11/2000 | Vega et al. | |
| 6,194,898 B1 | 2/2001 | Magnuson et al. | |
| 6,195,006 B1 | 2/2001 | Bowers et al. | |
| 6,204,764 B1 | 3/2001 | Maloney | |
| 6,208,235 B1 | 3/2001 | Trontelj | |
| 6,208,874 B1 | 3/2001 | Rudisill et al. | |
| 6,281,794 B1 | 8/2001 | Duan et al. | |
| 6,411,208 B1 | 6/2002 | Buess et al. | |
| 6,420,872 B1 | 7/2002 | Garroway et al. | |
| 6,429,768 B1 | 8/2002 | Flick | |
| 6,522,135 B2 | 2/2003 | Miller et al. | |
| 6,529,169 B2 | 3/2003 | Justice | |
| 6,535,175 B2 | 3/2003 | Brady et al. | |
| 6,597,318 B1 | 7/2003 | Parsche et al. | |
| 6,696,952 B2 | 2/2004 | Zirbes | |
| 6,777,937 B1 | 8/2004 | Miller et al. | |
| 6,814,284 B2 | 11/2004 | Ehlers et al. | |
| 6,825,754 B1 | 11/2004 | Rolin | |
| 6,900,633 B2 | 5/2005 | Sauer et al. | |
| 6,956,476 B2 | 10/2005 | Buess et al. | |
| 6,970,141 B2 | 11/2005 | Copeland et al. | |
| 6,989,750 B2 | 1/2006 | Shanks et al. | |
| 7,019,651 B2 | 3/2006 | Hall et al. | |
| 7,042,419 B2 | 5/2006 | Werner et al. | |
| 7,049,814 B2 | 5/2006 | Mann | |
| 7,064,668 B2 | 6/2006 | Porad | |
| 7,100,835 B2 | 9/2006 | Selker | |
| 7,132,942 B1 | 11/2006 | Buess et al. | |
| 7,215,293 B2 | 5/2007 | Chen et al. | |
| 7,330,161 B2 | 2/2008 | Matsugatani et al. | |
| 7,375,639 B2 | 5/2008 | Dixon et al. | |
| 7,460,071 B2 | 12/2008 | Manholm et al. | |
| 7,591,415 B2 | 9/2009 | Jesme | |
| 7,612,675 B2 | 11/2009 | Miller et al. | |
| 7,612,676 B2 | 11/2009 | Yuen et al. | |
| 7,714,724 B2 | 5/2010 | Halope et al. | |
| 7,714,791 B2 | 5/2010 | Lavedas | |
| 7,755,552 B2 | 7/2010 | Schantz | |
| 7,808,389 B2 | 10/2010 | Finkenzeller | |
| 7,903,041 B2 | 3/2011 | LeVan | |
| 8,098,161 B2 | 1/2012 | Lavedas | |
| 8,674,697 B2 | 3/2014 | Apostolos et al. | |
| 8,717,242 B2 | 5/2014 | Lavedas et al. | |
| 9,484,632 B2 | 11/2016 | Lavedas | |
| 9,812,790 B2 | 11/2017 | Lavedas | |
| 2003/0146839 A1 | 8/2003 | Ehlers et al. | |
| 2003/0197653 A1 | 10/2003 | Barber et al. | |
| 2004/0006424 A1 | 1/2004 | Joyce et al. | |
| 2004/0207527 A1 | 10/2004 | Shanks et al. | |
| 2005/0093677 A1 | 5/2005 | Forster et al. | |
| 2005/0093678 A1 | 5/2005 | Forster et al. | |
| 2005/0179604 A1 | 8/2005 | Liu | |
| 2005/0212673 A1 | 9/2005 | Forster | |
| 2007/0185546 A1 | 8/2007 | Tseng et al. | |
| 2008/0231458 A1 | 9/2008 | Fein | |
| 2008/0238684 A1 | 10/2008 | Tuttle | |
| 2009/0021343 A1 | 1/2009 | Sinha | |
| 2009/0034595 A1 | 2/2009 | Kato et al. | |
| 2010/0001080 A1 | 1/2010 | Sim et al. | |
| 2010/0001914 A1 | 1/2010 | Lavedas | |
| 2010/0069011 A1 | 3/2010 | Carrick et al. | |
| 2010/0134291 A1 | 6/2010 | Lavedas | |
| 2011/0148733 A1 | 6/2011 | Fahs et al. | |
| 2012/0206238 A1 | 8/2012 | Lavedas | |
| 2012/0206309 A1 | 8/2012 | Lavedas et al. | |
| 2013/0307740 A1 | 11/2013 | Pajona | |
| 2014/0070810 A1 | 3/2014 | Robert et al. | |
| 2014/0118116 A1 | 5/2014 | Lavedas | |
| 2015/0160309 A1* | 6/2015 | Chou | G01R 33/0052 324/258 |

OTHER PUBLICATIONS

Notification of Transmittal of the International Search Report and the Written Opinion of the International Searching Authority, or the Declaration, PCT/US2009/049136, dated Aug. 4, 2009, 11 pages.

* cited by examiner

ALTERNATIVE NEAR-FIELD GRADIENT PROBE FOR THE SUPPRESSION OF RADIO FREQUENCY INTERFERENCE

CROSS-REFERENCE TO RELATED APPLICATIONS

This application claims benefit of Provisional Appln. 62/771,327, filed Nov. 26, 2018, the entire contents of which are hereby incorporated by reference as if fully set forth herein, under 35 U.S.C. § 119(e).

BACKGROUND

1. Field of the Invention

Certain of the embodiments described herein relate to RF (radio frequency) circuits, inductive structures, and related techniques and methods to improve sensitivity in remote sensing applications that suppress the reception of RF interference. This includes methods, and techniques, as well as systems, methods, and devices for improving near-field sensing applications, such as explosive detection and RFID systems (radio frequency identification systems).

2. Description of the Related Art

Electromagnetic waves propagating from antenna systems have near-field and far-field radiation regions. The near-field is a region near an antenna where the angular field distribution depends upon the distance from the antenna. The near-field is generally within a small number of wavelengths from the antenna and is characterized by a high concentration of energy and energy storage in non-radiating fields.

In contrast, the far-field is the region beyond the near-field, where the angular distribution of the field is essentially independent of the distance from the antenna. Generally, the far-field region is established at a distance of greater than $D^2/\lambda$ from the antenna, where D is an overall dimension of the antenna that is large compared to wavelength $\lambda$, the wavelength of the radiating signal. Generally, antenna radiation or the radiating signal is considered to propagate in the far-field region as a plane wave.

Antennas used to create and exploit the energy in their near-field are found useful in RFID, nuclear magnetic resonance (NMR), quadrupole resonance (QR), resonant power transmission, and other applications. Used in this manner, these antennas may commonly be referred to as sensor probes. For example, some Radio Frequency Identification (RFID) systems use near-fields for communications between the RFID transponder tag and the RFID interrogator. The energy stored in the near-field may also provide the power to drive a microchip embedded in a passive RFID transponder tag. RFID systems are typically wireless, non-contact systems that use radio frequency electromagnetic fields to transfer information from an RFID card or transponder tag to a reader or interrogator for the purposes of automatic identification and/or tracking of the item to which the tag is attached.

The sensor probe antennas may be oriented vertically or horizontally depending on the orientation of the target.

At least some known explosive detectors and RFID systems use loop-type radiators (i.e., loop-type transmitting antennas) for the interrogator or transmitting antenna, for example, an antenna consisting of a figure-eight shaped conductor, to reduce the creation of energy in their far-field regions. That is, loop antenna systems can be designed such that the coupling between the antenna and its nearby surroundings (i.e., the near-field) is relatively high, whereas the coupling between the antenna and its distant surroundings (i.e., the far-field) is minimized. Since the near-field energy is most important for these sensor probes, such as the probe of the present invention, a minimal far-field interaction is desirable. The relative strength of the near-field is enhanced relative to the unwanted far-field.

To minimize the far-field interaction, two or more loops are used in combination, where the loops may have a specific size and geometry, such that the magnitude and direction of the current within the loops generate fields that cancel each other in the far-field region (that is, the vector sum of the fields created from each of the antenna loops is close to zero). Dependent upon the intended purpose of the system, suppression of interaction with the far-field region can be confined to either the receive or the transmit function of the system or both can be suppressed.

For example, it is desirable to suppress the far-fields created by the transmit function of some RFID systems to permit the creation of stronger near-fields to power passive tagging chips at greater distances from the interrogator. Conversely, when suppression of far-field sourced RF interference is the primary objective, it is desirable to mitigate interaction with the far-field in support of receiving weak signals initiated in the near-field region of the sensor system.

Specifically, when using a loop antenna system as described above in a receiving mode, energy emanating from the far-field region induces voltages in the loops that are equal in magnitude, but opposite in polarity, such that they sum to zero at the output terminals of the receiving antenna, while the reception of near-field signals is little affected. This far-field suppression is a desirable feature in an antenna for use in sensor probes, such as explosive detectors.

One application for near-field sensor probes (including those using loop-type radiators as described above) is a detection system that exploits a material's Nuclear Quadrupole Resonance (NQR), where NQR is a radio frequency (RF) spectroscopic technique for detecting and identifying a wide range of materials based on detection of the resonances associated with their quadrupolar nuclei. The energy transmitted from a near-field probe excites this resonance in a material exhibiting this NQR resonance characteristic. The material then radiates a response signal, which must be detected by the probe's receiving antenna in the presence of radio frequency interference (RFI) in the environment and typical Gaussian noise in the receiver. The NQR response signal provides a unique signature of the material of interest that indicates the presence of quadrupolar nuclei in the radiated material. Exemplary uses for NQR detection include (but are not limited to), screening of airline baggage, parcel screening, detection of drugs/narcotics, and detection of explosives, such as detection of buried mines and Improvised Explosives Devices.

One drawback with systems that use near-field probes and related technologies, especially for detection and screening of explosives, is the need to operate in the presence of significant RFI, especially far-field RFI. Therefore, some means of suppressing this interference without significantly degrading near-field performance is required. Systems for suppressing far-field RFI are known and at least one is described above (a loop-type antenna where the far-field radiation generates opposite-polarity voltages that cancel) but the various techniques provide different levels of suppression relative to the degradation of their sensitivity to nearby (near field) signals. That is, the net benefit of achieved RFI suppression is somewhat offset by a loss in signal levels received from the material under test via near-field radiation. Minimizing this loss in sensitivity, while maintaining a suitably high level of RFI suppression offers the potential to further enhance the performance of the detections system.

Suppression of RFI is particularly relevant for NQR systems, because the responses are relatively weak signals in segments of the RF spectrum occupied by high-power radio stations and subject to significant man-made and atmospheric noise sources. Detection of NQR signals, using a near-field probe (antenna) such as a loop antenna, can be difficult in the presence of strong far-field noise sources/signals, such as AM radio transmitters, and nearby noise sources/signals, such as automobile ignitions, fluorescent lighting, computers, mobile phones, and other electronics devices.

The presence of these strong far-field noise sources/signals presents a difficulty that arises at least in part because these kinds of noise sources can create substantial coherent and non-coherent geographically distributed noise that can be within the detection frequency ranges of interest. For example, detection of land mine explosives such as tri-nitrotoluene (TNT) can be affected by amplitude modulation (AM) radio signals sourced in the far-field, because the characteristic detectable frequencies associated with TNT (used in NQR detection systems) are below 1 MHz, which is within the standard AM radio band.

It is desirable to suppress RFI emanating from distant sources, so that this RFI does not interfere with detection of the desired signal. Some known implementations that attempt to suppress far-field RFI use a single sensor probe to implement both transmit and receive functions, augmented with a remote RFI sampling antenna (which senses all energy in its vicinity, but is conventionally placed at a location where it will be less sensitive to the desired target's response to near-field energy) coupled to a weighted negative feedback loop to cancel the RFI and thereby reduce probe susceptibility to RFI. Such a system is referred to as an active cancelation network.

This kind of implementation can introduce undesirable performance compromises that can lead to performance degradation. In particular, the desire to maximize efficiency of the receive function works in opposition to the desire to limit the time it takes for the transmit energy in the probe to dissipate after the transmit pulse has ended. That is, it is preferable to limit the coupling between the transmit and receive energy in the probe. In fact, overall system performance is further improved by separating components associated with the transmit and receive functions so that each can be optimized for its specific function.

Additionally, the effectiveness of a remotely located sampling antenna is limited because the distributed nature of the RFI causes signals that are acquired from locations different from the location of the sensing probe to vary significantly in ways that cannot be fully compensated by adjusting the phase and amplitude of the signal derived from the sampling antenna.

Specifically, the response from the remote sampling antenna(s) does not exactly match the response derived from the sensor probe. Outside of a narrow frequency band, the responses will differ in one or both of amplitude and phase. Use of remote sampling antennas can also impose stringent linearity requirements on the active components of the probe system, that is, the first stage of amplification (e.g., a low-noise amplifier (LNA)) to assure the desired response signal is not lost because of saturation of the amplifier before the response signal reaches the RF-interference cancelation stage.

Still other implementations may incorporate shielding over some or all of the probe in an attempt to reduce RFI; this is more common with larger resonant probes, and can result in bulky probe configurations. Further, such shielding is best suited for detection of buried threats, but is much less effective in personnel screening applications.

Several previously patented inventions (U.S. Pat. Nos. 8,717,242 and 8,717,242) and a published patent application of a pending application (US 20150372395 A1) by the current inventor have described means of suppressing RFI using a set of properly connected and properly sized, collocated loops. Specifically, two or more smaller loops are collocated at the center of a larger loop such that the total area of the smaller loops equals the area of the larger loop. The smaller loops are connected to the larger loop such that the voltage induced in the smaller loops by any RF interference sourced at a distance, that is in the far-field, is equal and opposite in polarity to the voltage induced in the larger loop. Thus, the interconnection of the loops acts passively to minimize the voltage developed due to far-field radiation impinging on the small and large loops.

However, in this system the fields generated proximate the loops (near-field radiation) do not induce equal voltages in the various loops. Specifically, the voltage induced by fields generated by sources near the larger loop is significantly less than the voltage generated in the smaller loops. For this reason, this combination of loops is seen to be a very effective means of sampling fields nearby, while rejecting fields sourced from substantially greater distances.

While this prior art technique offers a very significant potential to suppress the interaction with the far-field, whether suppressing generation of the far fields as part of a transmit function or suppressing reception of the far fields in a receive function, it is found to be fairly costly regarding sensitivity to signals confined to the near-field region of the probe. That is, this technique reduces near-field sensitivity to achieve a very similar amount of far-field suppression. Further, in practice, the extremely high suppression factors theoretically possible with such co-located geometries have been found to be limited by vagaries of the practical implementations of such systems. Specifically, practical RFI suppression is found to be significantly less than six orders of magnitude due to factors beyond the control of the system design, such as interactions with the environment near the system installation.

Therefore, it is the intention of the invention described here to improve the near-field sensitivity relative to the prior art, while seeking to maintain the practical level of RF suppression previously demonstrated by said prior art approaches.

SUMMARY

The following presents a simplified summary in order to provide a basic understanding of one or more aspects of the embodiments described herein. This summary is not an extensive overview of all of the possible embodiments, and is neither intended to identify key or critical elements of the embodiments, nor to delineate the scope thereof. Rather, the primary purpose of the summary is to present some concepts of the embodiments described herein in a simplified form as a prelude to the more detailed description that is presented later.

In one embodiment, five loops are configured such that a larger central loop is surrounded by a number of smaller loops (e.g., four) near or at the periphery of the central loop (and referred to as peripheral loops) and uniformly distributed (or equally spaced) around the central loop. For example, one configuration comprises a square central loop of area A with four smaller loops each of area A/4 placed adjacent to the corners of the larger central loop and oriented relative to the central loop corner-to-corner. Electrical connections are made to the loops such that the current flowing in the larger (inner) loop flows in the opposite direction in the smaller outer or peripheral loops.

The far-field created by a current in a loop having dimensions much less than a wavelength is dependent only on its enclosed area and not its shape. And since the field pattern of such electrically small loops is fundamentally identically independent of the size or shape of the loop, the effect of this geometry is to render a net far-field that is substantially suppressed. In practice, the level of suppression is almost entirely dependent on the difference in phase delay between the centers of the central loop and the peripheral loops. That is, if the spacing is small relative to a wavelength, the suppression achieved is substantial.

In a second implementation, twice as many smaller loops are sized to sum to the area of the larger central loop (each smaller loop having an area $\frac{1}{8}^{th}$ of the larger loop), but rather than arrayed uniformly around the larger loop they are placed in pairs at the four corners (for a larger loop that is square-shaped) of the larger loop. That is, nine total loops where four pairs are positioned at the four corners of the central, larger loop. This approach permits use of a larger central loop, without increasing the plan footprint for the probe. The result increases the volume of usable coverage in area and/or distance from the plane of the probe. That is, it results in greater sensitivity to near-field radiation while negligibly affecting the achievable suppression of the far-field. In this embodiment, the near-field sensitivity at a given distance is greater than for a smaller central loop, while the maximum phase dispersion is only slightly worse than the five-loop configuration described above.

In an analogous manner, the number of grouped smaller loops; three, four or more, can be placed at the corners of the larger loop(s), with the proviso that the smaller loops are sized to yield a composite area equal to that of the larger central loop. These grouped loops can be placed with their centers arrayed on a line normal to the plane of the probe (i.e., stacked) and/or nested in the same plane as the probe and each having slightly different diameters while maintaining the required composite area as described elsewhere herein. That is, if eight outer loops are used, for example, each of the pairs can be placed in a single plane by making one loop slightly smaller than $\frac{1}{8}^{th}$ of the area of the larger loop and another loop made slightly larger, such that the sum of the two areas is equal to $\frac{1}{4}$ the area of the larger central loop. Two outer loops can therefore nest together in a single plane, rather than requiring two planes to stack the two loops.

As noted earlier, the shape of the various loops does not have a noticeable effect on the performance of the probe assembled as described herein. However, particular shapes do offer the opportunity to create geometries that provide a more efficient packing of the loops within a defined boundary. Because less space in the plane of the probe remains outside of an actively excited loop, the probe exhibits a slightly higher sensitivity to near-field signals, while potentially reducing the phase dispersal between the inner and outer loops (due to the close packing of the loops) and thereby improving the potential suppression of the far-field interaction. In particular, one preferred implementation uses circular loops for both the inner (larger) and outer (smaller) loops.

Polygons with eight or more sides exhibit very nearly the same performance as that exhibited with the use of circular loops.

Further enhancement of the packing efficiency is achieved by enlarging the central loop out toward or to the boundaries of the space allocated to the probe in a particular system environment. Such an implementation would by necessity require the smaller loops to impinge upon or overlap the area (also referred to as the interior region) occupied by the larger loop. Assuming the larger central loop is circular or octagonal, the smaller outer loops would need to be placed partially inside and partially outside that boundary. However, when the shape of the individual loops is not square, that is a polygonal or a circular shape, the overlap is not total, since in a presumed rectilinear planform, there are regions outside of the polygonal or circular shapes that remain within the rectilinear boundary. In particular, this approach is best suited to the use of groups of multiple smaller loops as their individual areas impinge on the area defined by the larger loop to a lesser degree than for the case that makes use of four single loops.

While it is likely that the smaller and larger loops are chosen to have congruent shapes, this is not a necessary condition for this approach to achieve the expected performance. The only necessary stipulations are that the areas of the two types of loops sum to the same value, are electrically small, carry identical current and are connected in a manner consistent with the desire to reverse the polarity between the inner and the outer loops.

In another preferred implementation, the single central loop is replaced with two loops of equal size and four outer loops are sized to equal the area of the two central loops. The outer loops have linear dimensions that are 70.7% the dimensions of the central loops and are connected to the pair of central loops in a manner to reverse the currents flowing in the four outer loops relative to current flow in the two inner loops. That is, the loops are sized using a factor of 70.7% ($1/\sqrt{2}$) of each linear dimension (height and width) relative to the linear dimensions (height and width) of each of the central loops. Thus, the area of the each of the smaller loops is one half the area of either of the two central loops. Such a configuration exhibits an added feature in that the H-field (magnetic field) near the plane of the probe is significantly higher than for other configurations having the same input current. Calculations show that these near-fields can exceed those for the previously described probe having two central loops and a single, larger concentric loop, as well as a higher field-strength farther from the plane of the probes. The larger H-field near the plane of the probe results in a near field with a higher field strength for the same input current.

It is noted here that the selection of four groups of outer loops (each group comprising two loops) is not completely arbitrary. Using fewer groups of smaller loops, say two or three, results in a certain level of suppression of the far-field interaction. In addition, increasing the number of groups beyond four is possible. However, fewer than four groups, while considered to be included as part of the scope of this invention, results in either reduced far-field suppression or offers an inferior area utilization. Increasing the number of groups, while again considered to be within the domain of this invention, leads to performance analogous to that of the previously described system of loops in U.S. Pat. No. 7,714,791 having collocated centers, upon which this invention seeks to improve.

In another embodiment, an independent input port is achieved by introducing the properly sized conventional single turn loop at the appropriate distance from the differential probes described herein and a device that is suitable for fine adjustment of the mutual magnetic coupling between said probes is illustrated and described below.

In another preferred implementation a small set of figure-eight shaped loops are used to adjust the amount and polarity of mutual coupling between the two probes to establish a maximum level of isolation between them.

Still other aspects, features, and advantages of the invention are readily apparent from the following detailed description, simply by illustrating a number of particular embodiments and implementations, including the best mode contemplated for carrying out the invention. The invention is also capable of other and different embodiments, and its several details can be modified in various obvious respects, all without departing from the spirit and scope of the invention. Accordingly, the drawings and description are to be regarded as illustrative in nature, and not as restrictive.

BRIEF DESCRIPTION OF THE DRAWINGS

The present invention is illustrated by way of example, and not by way of limitation, in the figures of the accompanying drawings, in which like reference numerals refer to similar elements and in which.

DETAILED DESCRIPTION OF THE INVENTION

Figure 1:
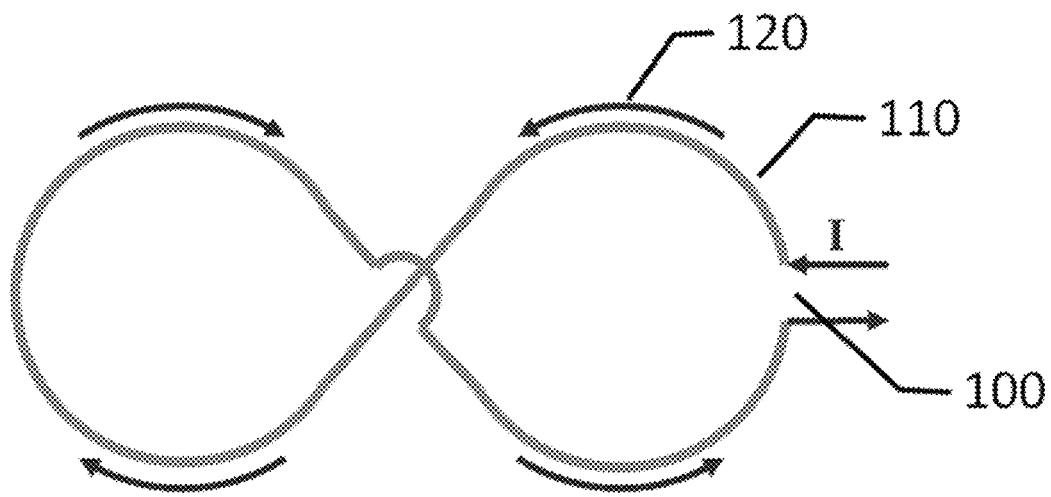
FIG. 1 illustrates a probe configuration of loops, commonly known as a figure-eight, as known in the prior art.

A method and apparatus are described for a near-field gradient probe for suppressing radio frequency interference. In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

Notwithstanding that the numerical ranges and parameters setting forth the broad scope are approximations, the numerical values set forth in specific non-limiting examples are reported as precisely as possible. Any numerical value, however, inherently contains certain errors necessarily resulting from the standard deviation found in their respective testing measurements at the time of this writing. Furthermore, unless otherwise clear from the context, a numerical value presented herein has an implied precision given by the least significant digit. Thus, a value 1.1 implies a value from 1.05 to 1.15. The term, "about" is used to indicate a broader range centered on the given value, and unless otherwise clear from the context implies a broader range around the least significant digit, such as "about 1.1" implies a range from 1.0 to 1.2. If the least significant digit is unclear, then the term "about" implies a factor of two, e.g., "about X" implies a value in the range from 0.5×to 2×, for example, about 100 implies a value in a range from 50 to 200. Moreover, all ranges disclosed herein are to be understood to encompass any and all sub-ranges subsumed therein. For example, a range of "less than 10" for a positive only parameter can include any and all sub-ranges between (and including) the minimum value of zero and the maximum value of 10, that is, any and all sub-ranges having a minimum value of equal to or greater than zero and a maximum value of equal to or less than 10, e.g., 1 to 4.

Some embodiments of the invention are described below in the context of suppressing far-field interference in an application for detecting and screening explosives. However, the invention is not limited to this context. In other embodiments the inventions can be employed to suppress far-field interference in an application where it is desired to measure or sense an attribute of near-field radiation or to suppress the generation of far-field radiation when it is desired to maximize the energy in the near field.

According to the prior art, specific geometries have been designed to maximize suppression or interaction with the far-field region around a sensor probe. This is contrary to the common intention of a radiating system antenna design, where the objective is to maximize the creation of the far-fields This is commonly accomplished by reducing the energy present in the vicinity immediately adjacent to the antenna structure, as such energy is merely stored in that region and can limit the usable bandwidth of said antenna.

The reverse is the intention of some probes used to excite or sense the region nearby a sensor probe, as is the case here. In some applications, it is advantageous to significantly reduce the far-field radiation from the probe, such that the energy in the near-field can be maximized. This is especially true for some RFID systems, specifically those operating in the 13.56 MHz ISM band. Reciprocally, some applications benefit from the suppression of the reception of energy sourced far from the sensor probe so that weaker signals nearby the probe are not masked.

One common approach to suppress interaction with the far-field region of a sensor probe is to institute a probe geometry such that the energy in one or more parts of the probe is subtracted from the energy present in another part of the sensor probe. Thus, the resultant energy is the difference of the energy in the parts as opposed to the sum. This results in a probe that is responsive to the gradient (rate of change) of the field created by the probe and the far field energy that impinges upon the probe. Energy emanating from a great distance from the probe is very substantially planar (a plane wave) and therefore has almost no gradient. However, a penalty is paid in instituting such a differencing condition in the probe in that some loss in sensitivity results throughout the region around the probe, i.e., the near field region. By the antenna reciprocity theorem, the differencing probe condition also suppresses the near-field radiation created for a given input current (power). It is therefore beneficial to minimize the penalty incurred, while achieving a desired level of suppression of the far-field interaction (i.e., both generating far-field energy and receiving far-field energy).

Also, according to the antenna reciprocity theorem, any approach that suppresses far-field reception in a receive application also suppresses creation of far-field radiation in a transmit application.

In possibly the simplest embodiment of prior art which achieves some level of far-field suppression is pictured in FIG. 1. It comprises two equally sized small loops 110, and 120 positioned in a single plane side by side. The current 120 from the feed point 100 is seen to progress counter-clockwise through the right loop and reverses direction to progress clockwise in the left loop. In this way the voltages induced by the fields far from the pair of loops are substantially the same and opposing and therefore suppressed. This is the common basis for all such far-field suppression approaches. That is, the imposition of opposing fields such that they tend to cancel at a distance great enough from the loops that the fields emanating from each of the separate parts (loops) of the probe are very substantially equal and opposite, that is, at a distance in the far-field region of the probe. While this geometry does achieve some level of suppression of the far-field interaction (i.e., in both transmitting and receiving modes), it also significantly degrades the performance in the nearby or near-field region both in area coverage and in sensitivity.

Figure 2:
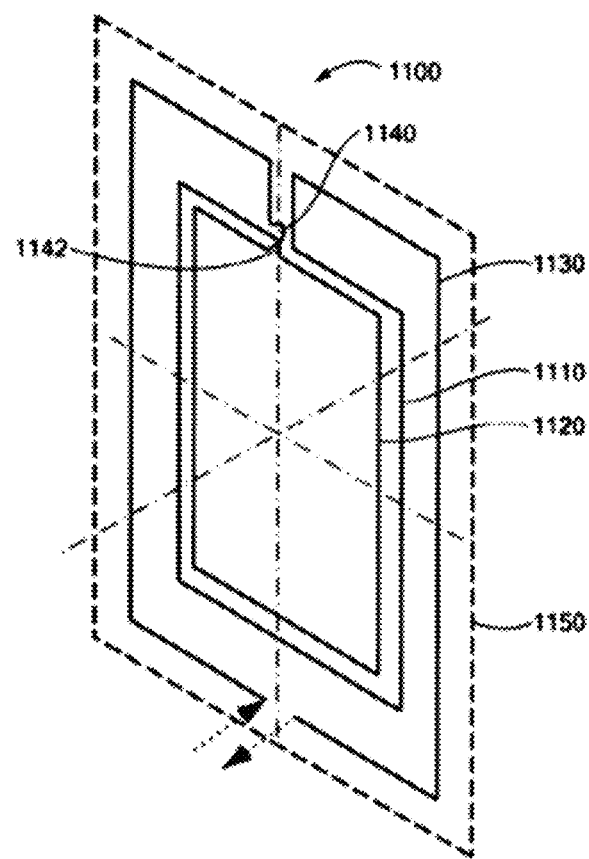
FIG. 2 illustrates a probe configuration of concentric, coplanar loops as known in prior art.

In a prior art field suppression device 1100 pictured in FIG. 2, the two smaller inner loops 1110 and 1120 are connected to the one outer loop 1130 in a manner at a junction through couplings 1140 and 1142 to cause the currents in the loops to flow in opposite polarities (clockwise directions). Note that all of the loops are contained within a single plane 1150. The area of the two smaller loops 1110 and 1120 are sized so that the sum of their areas equals the area of the larger outer loop 1130. Since the three loops are connected in series, the same current flows in each of the loops. Therefore, the current-area products of the larger and smaller loops are equal and current flows are opposite, which is a necessary condition to suppress the far-field interaction.

The objective of this geometric configuration in FIG. 2 is analogous to that of the prior art of FIG. 1, but has the added advantages of centralizing the strongest fields and minimizing the phase dispersion between the loops. The lack of significant phase dispersion maximizes the suppression of the far-field interaction, while the centering of the field acts to limit somewhat the degradation of the near-field that commonly occurs with such differential loop geometries.

However, it has been shown by experience that the practical suppression of the far-field interaction has a limit unrelated to the details of the design of such differential probes. It is presumed that this limit arises because the fields generated by the probe in a transmit mode or impinging upon it in a receive mode are not perfectly plane due to environmental factors beyond the control of the probe's design or geometry. Another contributing factor could be that perfect shielding of peripheral equipment necessary to create a full system implementation cannot be achieved. Therefore, in practice it is found that suppressing the far-field interaction beyond five orders of magnitude (50 dB) is difficult and reliably beyond six orders of magnitude (60 dB) is impractical. In light of this understanding, the current invention acts to maintain a practical level of far-field suppression, while reducing the amount of near-field degradation from that exhibited in the prior art implementations.

Figure 3:
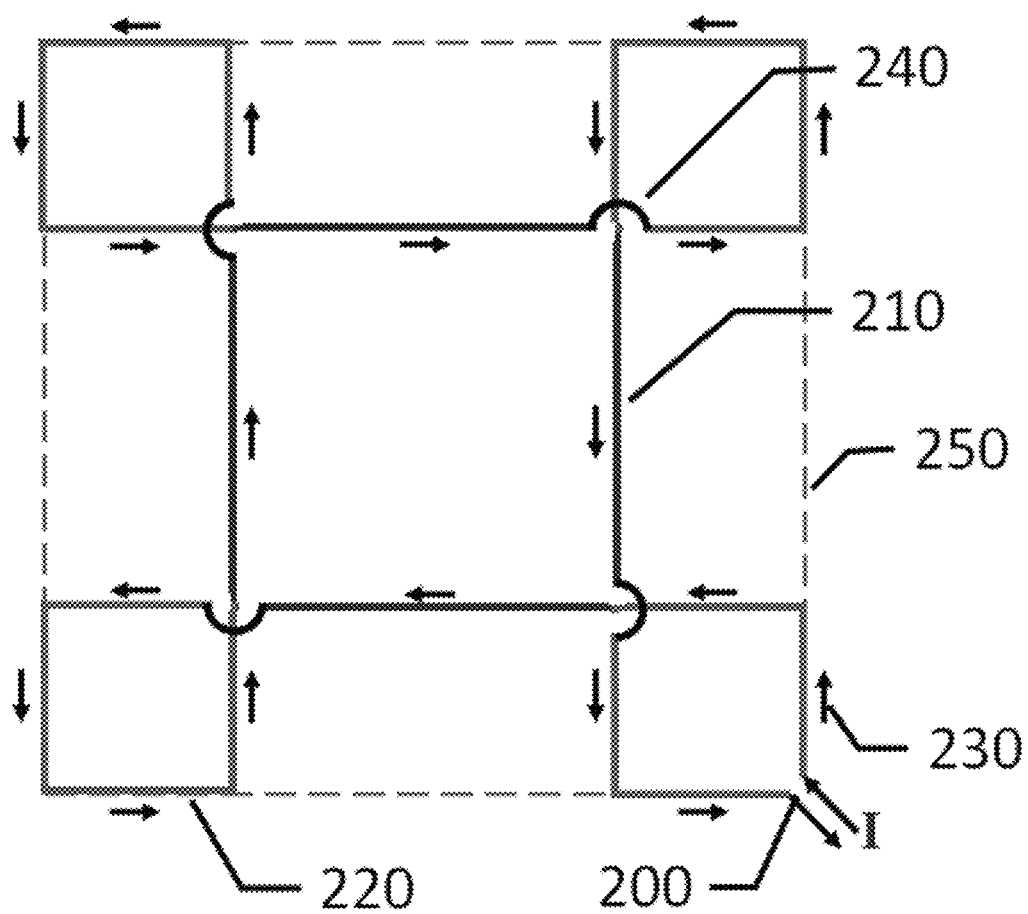
FIG. 3 illustrates an implementation of the current invention composed of five square loops for far-field suppression.

A fundamental implementation of the current invention is pictured in the embodiment of FIG. 3. The probe consists of square shaped loops with a central larger loop 210 and four identical smaller loops 220 arrayed uniformly and attached at the corners of the larger loop 210 through crossover interconnections 240. The impressed current 230 fed at a somewhat arbitrary feed point location, here placed at a convenient location at the lower left corner 200, is seen to flow through the larger loop 210 in an opposite clockwise direction from the direction of current flow through the four smaller loops 220. Note that the geometry is selected to fulfill the necessary condition of the sum of the area-current product of the smaller loops 230 being equal to the area-current product of the larger loop 210. Specifically, the smaller loop linear dimensions are one-half those of the larger loop. A dashed line 250 depicts the rectilinear boundary of the probe.

Note that if the current in the inner loop is not equal to the current in the outer/peripheral loops, maximum far-field suppression is achieved when the product of the area and current in the inner loop is equal to the product of the area and current (flowing in an opposite direction) in the outer/peripheral loops (referred to herein as the area-current product).

The shape of the various field suppression loops has almost no effect on the performance of the probes assembled as described herein. However, certain shapes do offer the ability to improve the packing efficiency of the loops within a defined boundary, that is, specifically to enclose a greater fraction of the area within a given boundary within the active central loop. The advantage of such geometries is threefold: first the phase dispersion between the various loops is decreased (where the phase dispersion limits far-field suppression); second the greater area increases sensitivity (higher H-field created for a given current when transmitting or higher voltage induced for a given field strength when receiving); and finally, the volume of coverage is increased.

Figure 4:
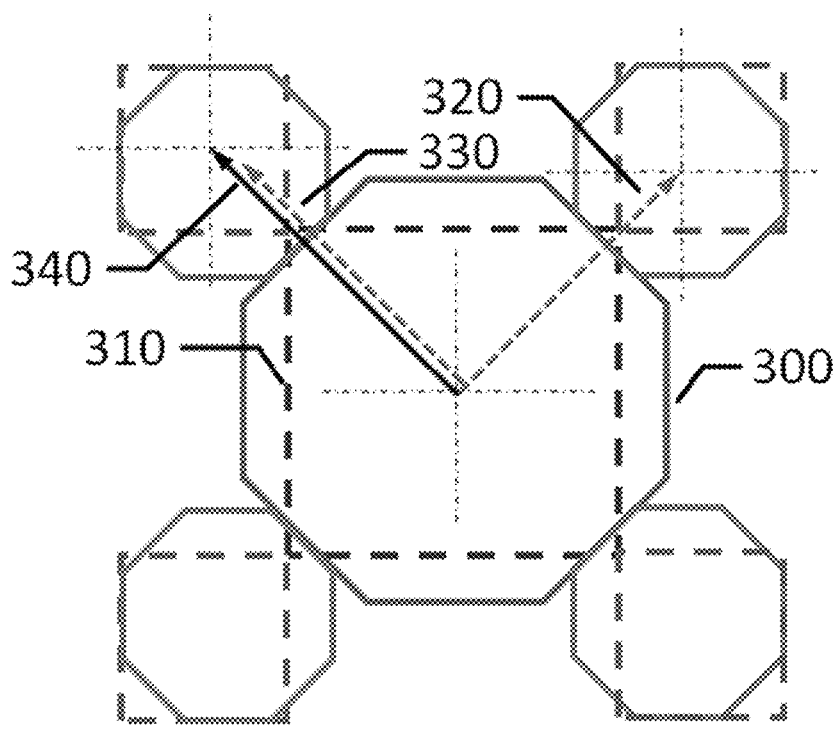
FIG. 4 illustrates a probe configuration of the current invention having four octagonal outer loops and one octagonal inner loop overlaid on the outline of an identically sized probe composed of square loops.

An example of the advantage provided by other than a square shape is depicted in FIG. 4, where the outline of a five-loop version of the invention (solid line 300) composed of octagonal loops is superimposed over a five-loop version of square loops (dashed line 310). The feed point of the sensor probe and interconnections between the central and peripheral loops are omitted for clarity, but the opposing relationship between the current in the larger (central) loop and the four outer loops is assumed.

Two distances in FIG. 4 are marked by arrows 320 and 340 between the geometric (phase) centers of the central loop (both the octagonal and square central loop) and the geometric (phase) center of one of the outer loops (both the octagonal and square outer loops) to illustrate the reduction in phase dispersion between the two embodiments (square and octagonal). Phase dispersion is dependent on the difference in arrival times at the constituent parts (loops) of the probe, as sourced in the far field. The arrowhead 330 (for the octagonal embodiment) is of identical length as that of the arrowhead 320, repositioned to allow easy visualization of the differences in length. For a square boundary as shown (arrowhead 340), the distance between the phase centers is reduced by 10% for the octagonal geometry relative to that of the probe configured with square loops. While not great, it is tending in a favorable direction. Decreasing the distance between the inner and outer loops has the effect of increasing the far-field suppression for a given sized probe. Therefore, the phase dispersion that can be tolerated sets the maximum size of the probe at a given frequency (wavelength) that meets the acceptable far-field suppression level.

It is also noted that the octagonal loop design results in an active area that is nearly 36% larger than that achieved with the square shaped loops. This translates directly into a greater field strength and amounts to a more than 2.5 dB increase in sensitivity to the near field radiation. An additional gain is achieved through the employment of a nine-loop configuration consisting of one central loop and eight smaller outer loops distributed in pairs at the corners, as with the five-loop configuration. As with other embodiment, the sum of the areas of the loop pairs is set equal to the area of the central loop. Since this is achieved with loops having smaller outer dimensions, the size of the central loop is increased within the original planform of the probe. This results in an area increase of nearly 42% relative to the five-loop configuration.

Figure 5:
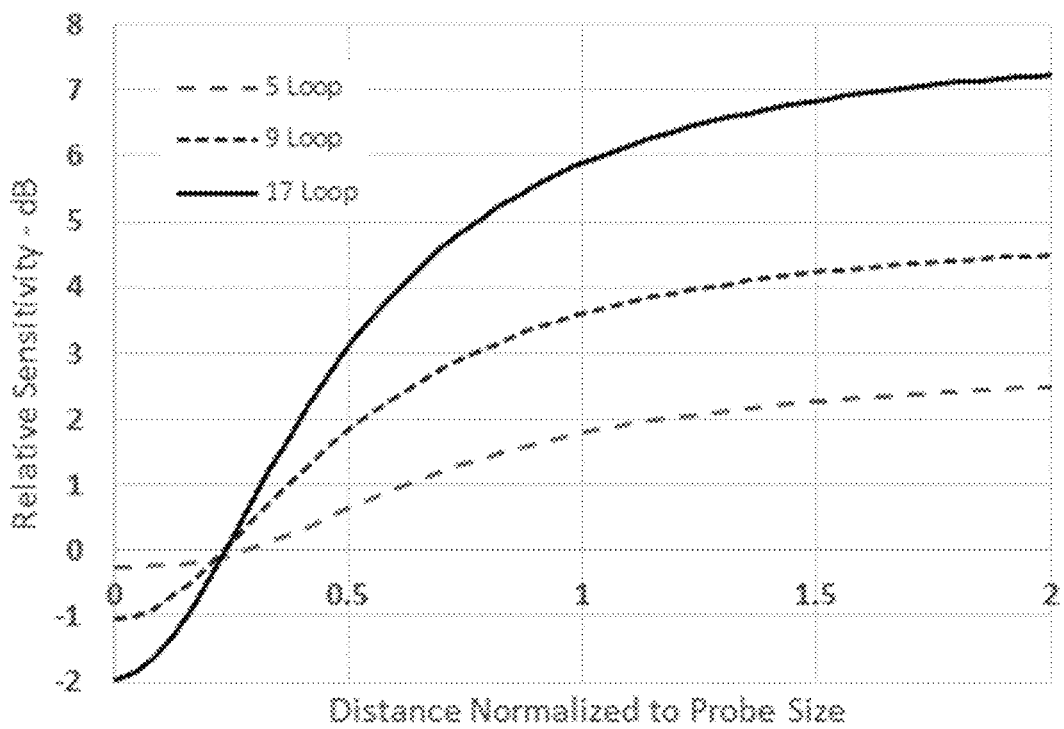
FIG. 5 illustrates the relative performance (relative gain in field strength) advantage the three probes configured as in FIG. 4 above with variously one, two and four outer loops at the four corners of the probe compared to the H-field strength of the prior art probe shown in FIG. 2.

The gain in sensitivity is characterized here as the relative increase in H-field along a line normal to the center of the plane of the probe when compared to that of the probe configuration of FIG. 2. FIG. 5 illustrates this gain for three large central loop probe configurations: One consisting of four smaller outer loops (as shown in FIG. 4), another with four pairs of outer loops (nine total) and a third having four sets of four outer loops (17 total). It is assumed each loop caries the same current.

It is noted that a slight reduction of sensitivity occurs for the large central loop configuration compared to one having two central loops and a single concentric outer loop (see FIG. 2) at distances less than about 25% of the size of the probe. However, this is not generally the most interesting region around such a probe. Rather, regions out to or beyond 100% of the size of the probe are of greater interest. This is especially true when two probes are arranged in an opposing spaced-apart relation to form a sensor gate for screening a target (such as personnel or vehicular) that is disposed between the two probes. In this case the gain is fairly modest at about 2 dB for the five-loop probe, but grows to nearly 6 dB for the 17-loop configuration. The gain results in a decrease in the time to detect contraband on the target by up to a factor of four. Such a timing improvement greatly enhances system performance by increasing throughput, increasing probability of detection, and/or decreasing false alarm rate.

As mentioned earlier, phase dispersion between the various loops of the central loop probe configuration limits the absolute level of achievable far-field interaction. The amount of phase difference between the central loop and the outer loops is determined by the distance between the phase center of the various loops. Note that geometrically, the phase center is at the center of a regular polygon or a circle. For other shapes, the phase center is located at the center of gravity of the shape.

Figure 6A:
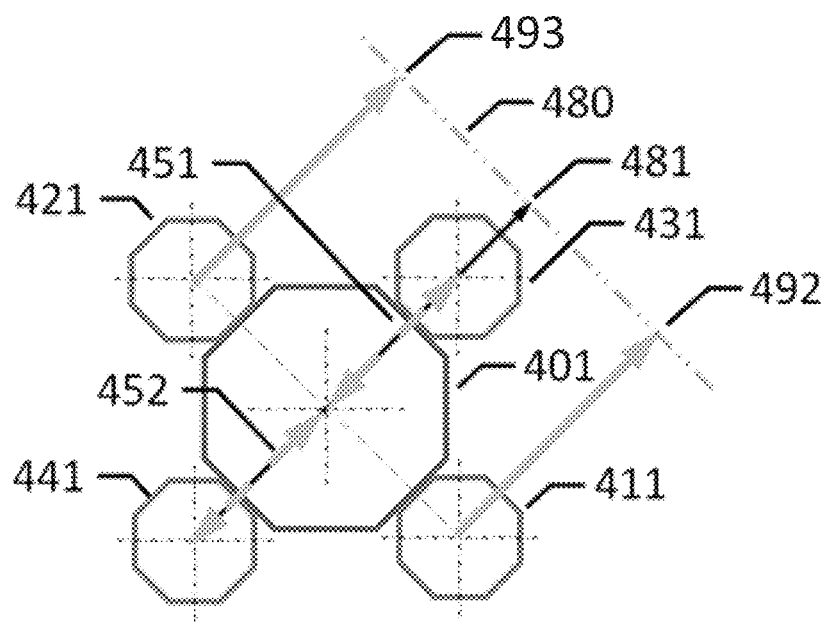
FIG. 6A illustrates a five-loop probe

The greatest amount of dispersion experienced by the probe configuration of FIG. 4 is along a line 481 in FIG. 6A, which passes through the centers of central loop, 401, and the two outer loops, 431 and 441, or the sets of outer loops at opposite corners of the central loop.

Figure 6B:
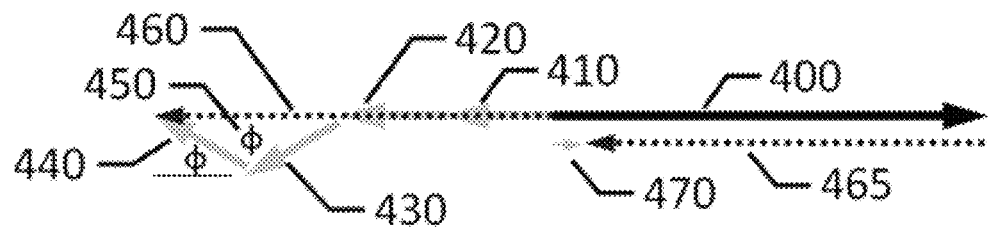
FIG. 6B illustrates a vector diagram of the resultant H-field created by the five-loop probe of FIG. 6A.

FIG. 6B illustrates a resulting vector diagram of a five-loop probe of this design. In it, the five-component field amplitude/phase vectors are represented by the arrows 400, 410, 420, 430 and 440, laid end to end. These correspond to fields from the loops 401, 411, 421, 431 and 441, respectively. The amplitude of the vector 400 is four times that of the other four vectors. Together, their fields sum to the plane wave front represented by the dashed line 480 in FIG. 6A.

Reciprocally, the vectors can be taken to be the amplitude and phase of the voltages at the feed point of each loop resulting from the presence of an incident plane wave arriving from the angle in question. The resulting vector 460 is the resultant from the summation of the fields of the four outer loops, 411, 421, 431 and 441. This vector is reproduced and repositioned as line 465 to illustrate the effect of subtracting the results of the two sets of loops (inner and outer). The small arrow, 470, illustrates the effect of combining the results of the two sets of loops.

The angle, $\phi$ at 450, is the dispersion angle of the field from loops 431, which leads that of the central loop, 401, and also the angle resulting from loop 441, which lags that of the central loop. These angles result from the time it takes to travel the two distances labeled 451 and 452 respectively. It is also noted that the resultants of the loops 411 and 421, and illustrated by rays 492 and 493, are in phase with the ray from the central loop, 491. The amplitudes of the four outer loops, 411, 421,431 and 441 are one quarter of that of the central loop.

Replacing sets of loops at the corners, say two, three, four or more loops, results in a nearly identical vector diagram, where the sum fields of the sets of loops is substituted for that shown here for the four-loop configuration. The only difference being the value for the phase dispersion angles, which depends on the spacing between the outer loops and the frequency of operation. That is the phase, $\phi$, is equal to the distance, 451 or 452 in this case, divided by the wave length at that frequency.

Expressed mathematically, the case pictured in FIG. 6A is given by EQ 1.

$$\text{Result} = 1 - \frac{1}{2} - \frac{1}{2} \cdot \cos\left(2\pi S \cdot \frac{f}{c}\right) \qquad \text{(Eq 1)}$$

Where S is the spacing between the loop phase centers, f is the operating frequency, c is the speed of light, and "Result" is a measure of the field suppression relative to the conventional loop. The phase dispersion is defined by the terms in parenthesis.

Using this equation, the theoretical far-field suppression factor at various frequencies as a function of frequency can be computed. Conversely, the maximum probe size can be determined at a given frequency such that a certain level of cancellation is theoretically achievable. For example, it is found that a planform in excess of 1.25 meters square yields an expected suppression factor of 60 dB or greater at a frequency associated with the nuclear quadrupole spectral response of the explosive material RDX (3.6 MHz). A suppression level of 50 dB is achievable with a probe that exceeds two meters.

But note that phase dispersion increases with the size of the probe. If the desired worst-case suppression is about 60 dB or better, then the probe should not be larger than 1.25 meters. If a suppression level of 50 dB can be tolerated, then the probe can be as big as 2 meters across. These parameters are applicable to a specific frequency since the equation incudes a frequency term.

The results are scalable to any frequency using an electrical length (in degrees). The two lengths given in the example, converted to degrees, are 5.4 degrees and 8.6 degrees. These same suppression levels can be achieved with even larger apertures for operation at lower frequencies. Thus, it is seen that the probe configurations described here do not impose significant size restrictions relative to those associated with prior art, especially when compared to practically achievable far-field suppression levels previously described here.

Figure 7:
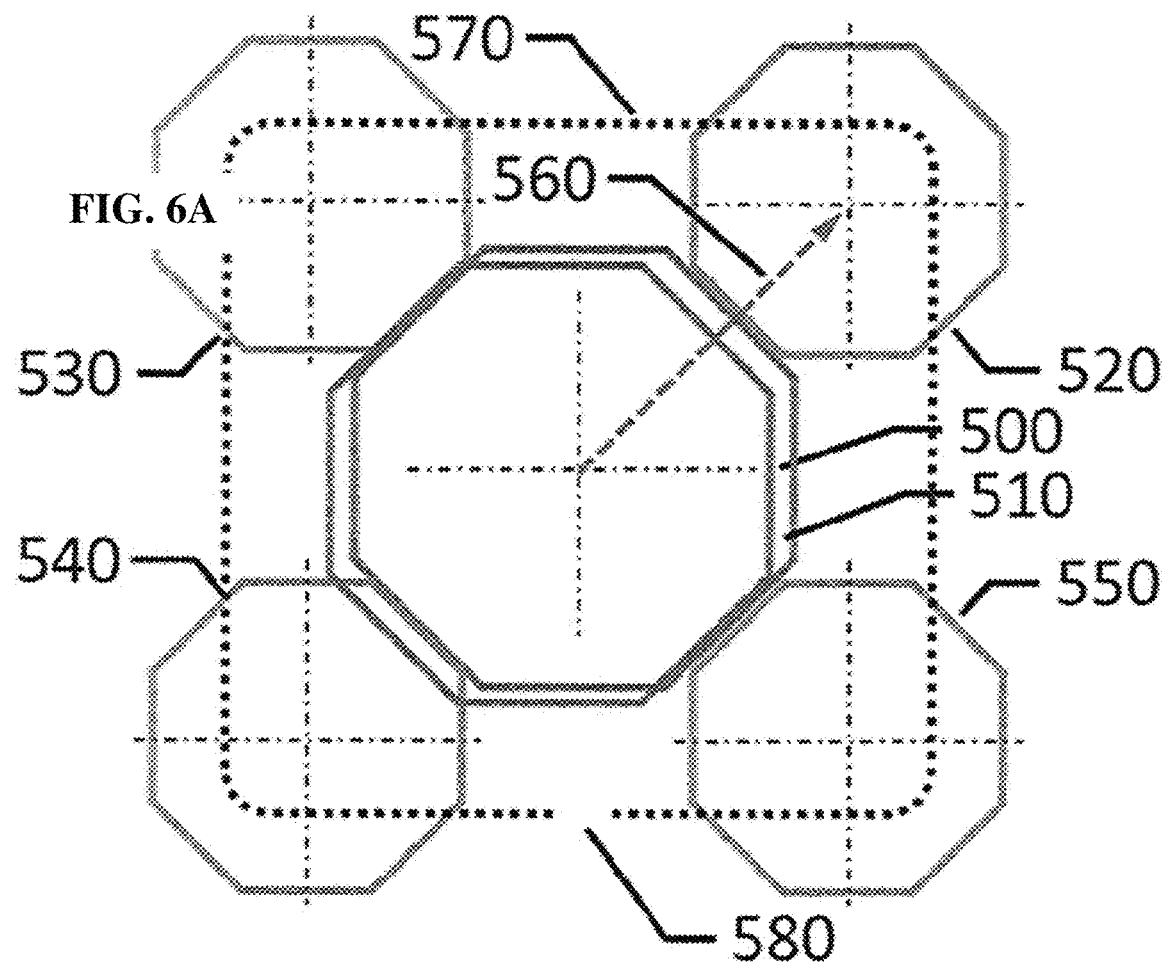
FIG. 7 illustrates an alternative probe configuration having two concentric inner loops and four outer loops and a magnetically isolated loop.

An alternative implementation, as illustrated in FIG. 7, results in substantially the same suppression levels as for the previously described probe of an equal size, but does not suffer from the loss of near-field sensitivity in the region immediately adjacent to the plane of the probe. This is achieved while maintaining a similar sensitivity to that of the five-loop configuration described above.

This alternative implementation of FIG. 7 employs two, equally sized, octagonal central loops, 500 and 510 surrounded by four properly sized outer loops, 520, 530,540 and 550. The two central loops are positioned in two planes (stacked) having a small separation from the plane of the complete probe. For example, in a first embodiment one of the two loops 500 and 510 is in the plane of the probe and the other of the two loops is placed a small distance from the plane of the probe. In a second embodiment both of the two loops 500 and 510 are placed a small distance from the plane of the probe. Further, one of the central loops 500 and 510 can be placed in the plane of the outer loops. This stacked arrangement is depicted in FIG. 7 where the loops 500 and 510 are shown in an offset orientation to convey the stacked arrangement.

Reference character 570 in FIG. 7 identifies a magnetically isolated probe loop fed at a feed point 580 for generating an incident transmitted signal to a target. Depending on the application, such a magnetically isolated loop may be used with other embodiments described herein.

In one embodiment a width of the central loops is about 52% of the width of the complete probe, while the width of each of the four outer loops is about 37% of the width of the complete probe. The maximum phase dispersion distance is denoted by an arrowhead 560.

Figure 8:
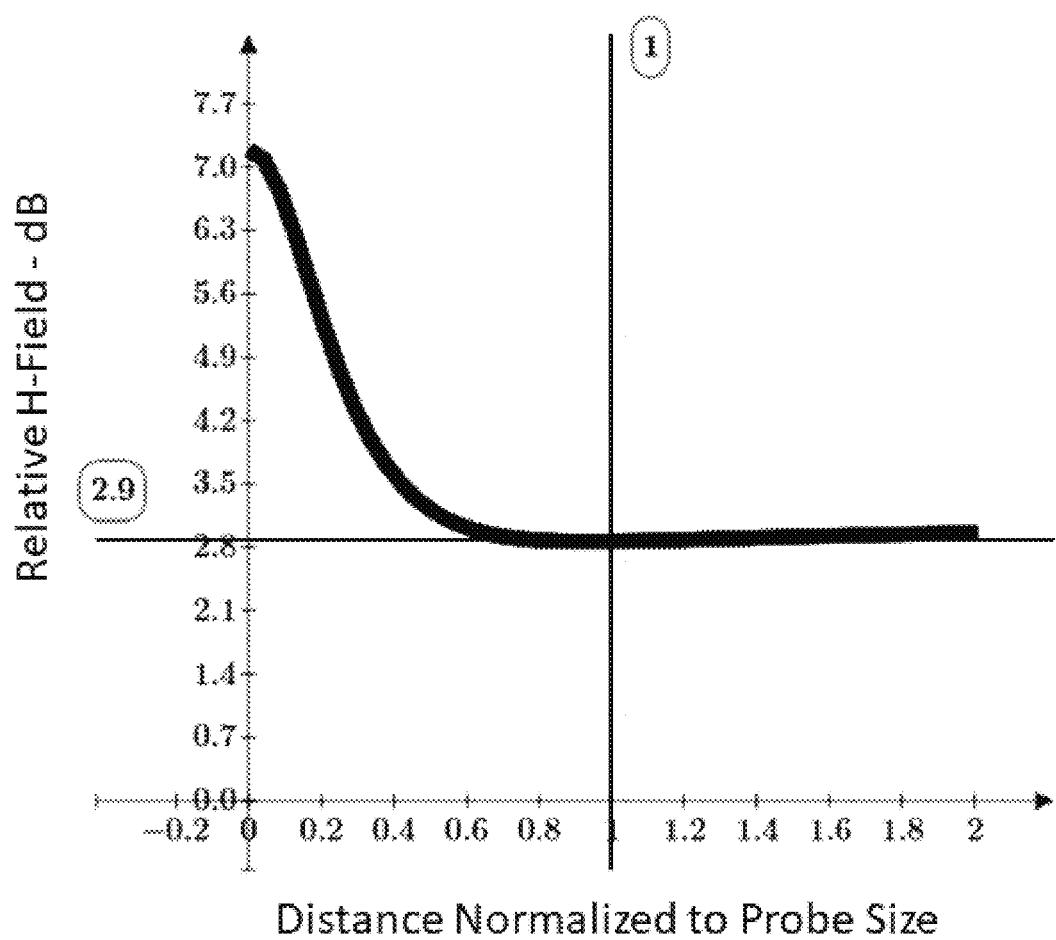
FIG. 8 shows the sensitivity performance of the probe of FIG. 7 compared to that of an equally sized probe as shown in FIG. 2.

The estimated sensitivity performance of the FIG. 7 configuration is shown in FIG. 8. This figure compares the H-field created for the implementation of FIG. 7 when compared to that of the design depicted in FIG. 2. Both probes are assumed to have the same outer planform dimensions and are driven with equal currents.

Figure 9:
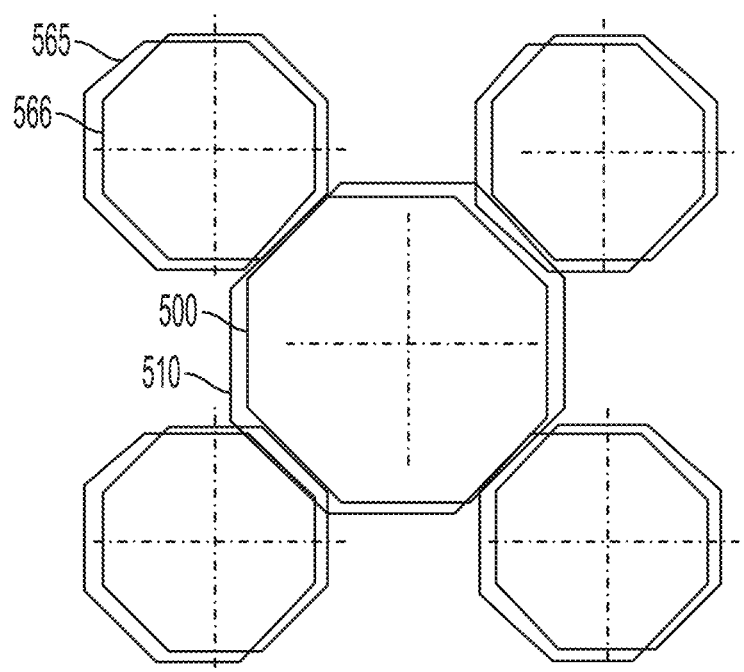
FIG. 9 illustrates an alternative probe configuration having stacked inner and peripheral loops.

Like FIG. 7, the embodiment of FIG. 9 depicts both the central loops 500 and 510 in a stacked orientation. Each pair of peripheral loops, such as the pair identified by reference characters 565 and 566, are also shown as offset to represent a stacked orientation.

Figure 10:
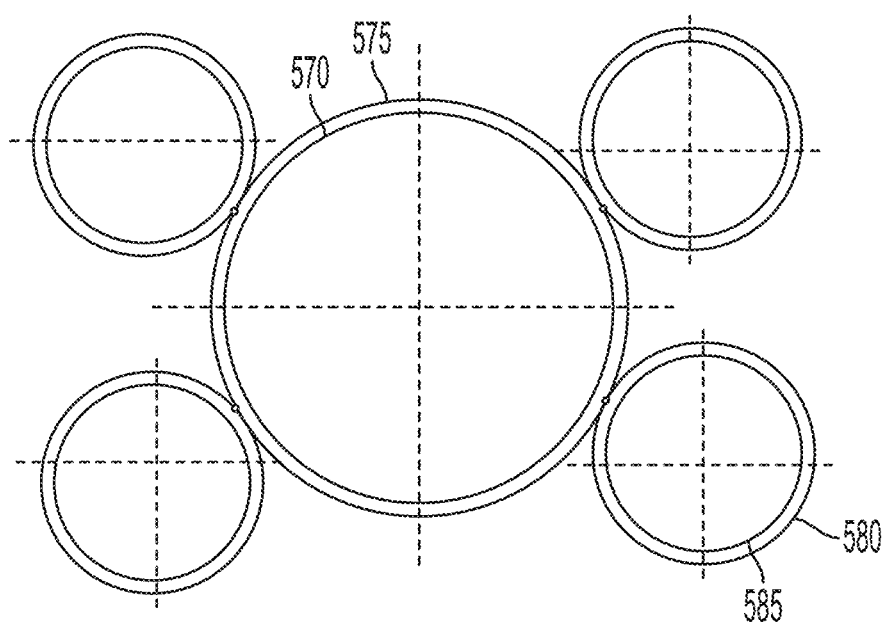
FIG. 10 illustrates an alternative probe configuration having nested central and outer circular loops.

Yet another approach places both loops in the same plane, but alters their size slightly, i.e., one larger and one smaller, to accommodate concentric placement. This nested arrangement is illustrated in FIG. 10 where a smaller inner central loop 570 is nested within a larger outer central loop 575. Each of the four peripheral loops also comprises a smaller inner peripheral loop (such as the smaller inner peripheral loop 585) and a larger outer peripheral loop (such as the larger outer peripheral loop 580). Like the other described embodiments, a sum of the areas of the eight peripheral loops equals the sum of the areas of the two central loops to maximize far-field suppression (assuming equal and oppositely-direct currents through the peripheral and central loops).

Figure 11:
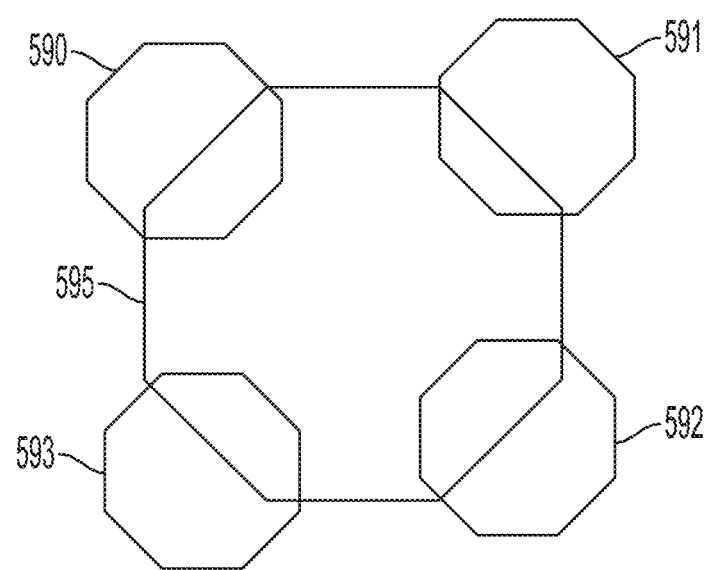
FIG. 11 illustrates an alternative probe configuration wherein octagonal peripheral loops extend into an interior region of a central octagonal loop.

In still another embodiment the peripheral loops extend into or overlap an interior region of the central loop. See FIG. 11, where peripheral loops 590, 591, 592, and 593 overlap into an interior region of a central loop 595.

Note that because of the differential nature of all the probe implementations presented herein, it is possible to introduce a second magnetically isolated probe loop that creates an independent probe port for transmitting an interrogation signal to a target, such as the probe loop 580 in FIG. 7. Conventionally, this probe loop comprises a single turn. The geometry of the various loop configurations presented causes the magnetic fields to cancel, and thereby the coupling between the two magnetic fields to cancel. The coupling has little or no effect on the capacitive (electric field) coupling, but that coupling factor is typically small for loop antennas. The isolation of this added probe loop is achieved through the proper sizing and placement in close proximity to any of the differential probes described above. For example, a square single turn loop probe properly sized and offset slightly behind or in front of the differential probe could be used to introduce a transmit signal. Specifically, applying tuning to match the probes to their source or load is easily achieved because of the isolated nature of the two ports. Adjustment of one tuning network has no noticeable effect on the tuning of the other when the proper geometry is implemented.

Such isolation is achieved by adjusting either the size (dimensions) of one of the loops at a fixed distance between the planes of the two probes and/or by adjusting the spacing between the two probes for a fixed size.

In another preferred implementation a small set of figure-eight shaped loops are used to adjust the amount and polarity of mutual coupling between the two probes to establish a maximum level of isolation between them. While generally, this isolation device can be used with any two probes, in the context of the present invention the device is located between the receive probe and the isolated second probe used for the transmitter.

Figure 12:
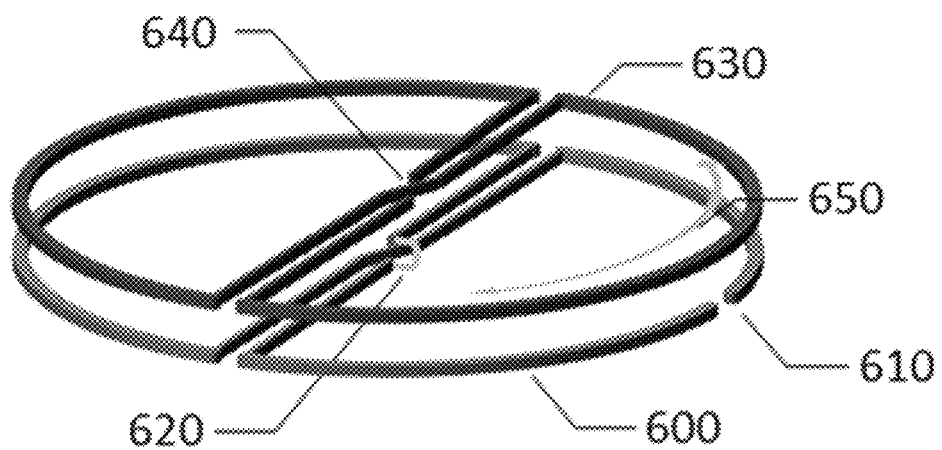
FIG. 12 illustrates a device made of two figure-eight shaped loops configured to provide a mechanism suitable for the fine adjustment of mutual coupling between two circuits, such as magnetically isolated near-field probes.

Such a device is pictured in FIG. 12. The illustrated device comprises a fixed figure-eight shaped lower portion, 600, having a feed point at 610 and a moveable upper portion, 630, with a feed point near its center of rotation, 640. The crossover of the figure-eight in the lower portion is the jumper 620. Not shown are the jumpers to the second circuit/probe at the top center of the upper plane/probe 630. The plane of rotation for the upper portion, 630, is illustrated by the arc 650. Connecting the fixed portion in series with the first probe and the moveable portion with flexible jumpers to the second probe permits the sum of the mutual coupling between the first and second probe to be adjusted. If it is assumed that the isolated probe is for the transmit function, the first probe is for the receive function. This variable inductor geometry acts to reduce radiation of or reception of nearby fields.

Rotating the moveable portion changes the amount of mutual coupling that occurs between the two circuits. As shown in the FIG. 12, the coupling is the maximum that can be achieved between the two halves. Rotating the upper portion 90 degrees in either direction (clockwise or counterclockwise) results in the minimum amount of coupling between the two halves. Continuing to rotate to 180 degrees results in the maximum amount of coupling between the two halves, but reverses the polarity (sense) of the coupling between the two halves. Thus, the full excursion in mutual coupling is achieved with just 180 degrees of rotation of the upper portion. Further the total coupling between the two circuits to which this device is connected is thereby adjustable such as to minimize the resultant coupling.

Although the various embodiments described and illustrated herein have depicted the various loops of the sensor probe in a horizontal configuration, the loops may also be oriented in a vertical configuration. The orientation of the loops necessarily depends on the orientation of the target to be probed. If the target is vertical, a standing person for example, the loops of the sensor probe are oriented vertically.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense. Throughout this specification and the claims, unless the context requires otherwise, the word "comprise" and its variations, such as "comprises" and "comprising," will be understood to imply the inclusion of a stated item, element or step or group of items, elements or steps but not the exclusion of any other item, element or step or group of items, elements or steps. Furthermore, the indefinite article "a" or "an" is meant to indicate one or more of the item, element or step modified by the article.

What is claimed is:

1. A sensor probe comprising:
   a conductive central loop;
   a plurality of conductive peripheral loops disposed peripherally relative to the central loop;
   the central loop and the plurality of peripheral loops configured such that current flows in a first direction through the central loop and in a second direction through each one of the plurality of peripheral loops, the first direction opposite to the second direction, and wherein current through the central loop equals current through the plurality of peripheral loops; and
   wherein the plurality of peripheral loops are equally spaced about the central loop, and wherein far-field suppression is responsive to a distance between a center of the central loop and a center of one of the plurality of peripheral loops, such that minimizing the distance increases far-field suppression.

2. The sensor probe of claim 1, wherein an area of the central loop is equal to a sum of an area of each one of the plurality of peripheral loops.

3. The sensor probe of claim 1, wherein a product of an area of the central loop and the current through the central loop equals a product of an area of the plurality of peripheral loops and a current through the plurality of peripheral loops.

4. The sensor probe of claim 1, wherein a shape of the central loop, and a shape of each one of the plurality of peripheral loops comprises a same closed geometric figure, the same geometric figure further comprising a polygon or a circle.

5. The sensor probe of claim 1, wherein the plurality of peripheral loops comprises four, five, nine, or seventeen peripheral loops.

6. The sensor probe of claim 1, wherein the plurality of peripheral loops comprises a first, second, third, and fourth peripheral loop, the sensor probe further comprising a fifth, sixth, seventh, and eighth peripheral loop each paired with a respective first, second, third, and fourth peripheral loop, wherein a sum of an area of each one of the first through eighth loops equals an area of the central loop.

7. The sensor probe of claim 1, wherein the central loop and the plurality of peripheral loops are each defined by a perimeter and oriented such that a perimeter segment of each peripheral loop is proximate a perimeter segment of the central loop, and the peripheral loops are spaced equally around the central loop.

8. The sensor probe of claim 1, further comprising a magnetically isolated loop for transmitting an incident signal directed at a target and receiving a reflected signal from the target, the magnetically isolated loop comprising feed points for receiving a current producing the incident signal.

9. The sensor probe of claim 1, wherein a distance between a center of the central loop and a center of each one of the plurality of peripheral loops is less than about 5% of a wavelength of signals impinging the sensor probe.

10. The sensor probe of claim 1, wherein the plurality of peripheral loops comprises eight peripheral loops configured in four stacks of two peripheral loops, and wherein the loops of each stack are concentrically oriented, and wherein each stack is oriented such that a perimeter segment of each stack is proximate a perimeter segment of the central loop, and the stacks are spaced apart equally around the central loop.

11. The sensor probe of claim 1, wherein the plurality of peripheral loops comprises eight peripheral loops configured in four groups of two peripheral loops, wherein within each group a first peripheral loop is nested within an interior region of a second peripheral loop, each group oriented such that a perimeter segment of each group is proximate a perimeter segment of the central loop, and the groups are spaced apart equally around the central loop.

12. The sensor probe of claim 1, wherein an interior region of each one of the plurality of peripheral loops overlaps an interior region of the central loop.

13. The sensor probe of claim 1, wherein a shape of the central loop is congruent with a shape of each one of the plurality of peripheral loops.

14. The sensor probe of claim 1, wherein the plurality of peripheral loops comprises four peripheral loops, and wherein a geometric figure of the central loop and the four peripheral loops comprises a square, each of the four peripheral loops oriented corner-to-corner relative to the central loop.

15. The sensor probe of claim 1, wherein the central loop comprises two equally-sized central loops and the plurality of peripheral loops comprises four peripheral loops, wherein an area of the two central loops is equal to a sum of an area of each one of the four peripheral loops, and wherein current through the two central loops is equal to and flows in an opposite relative to current flow in the four peripheral loops.

16. A component for providing a variable terminal inductance:
   a first conductive element in a figure-eight configuration spaced apart from and parallel to a second conductive element in a figure-eight configuration;
   the first conductive element connected in series with the second conductive element;

the first conductive element having a discontinuous segment therein, first and second terminals formed at ends of the discontinuous segment; and wherein the first conductive element is rotatable in a plane of the first conductive element relative to the second conductive element for changing a mutual inductance between the first and second conductive elements and thereby changing a terminal inductance at the first and second terminals.

* * * * *